(12) United States Patent
Tsuji

(10) Patent No.: US 8,212,309 B2
(45) Date of Patent: Jul. 3, 2012

(54) NON-VOLATILE MEMORY DEVICE AND METHOD OF MANUFACTURING SAME

(75) Inventor: Yukihide Tsuji, Tokyo (JP)

(73) Assignee: NEC Corporation, Tokyo (JP)

( * ) Notice: Subject to any disclaimer, the term of this patent is extended or adjusted under 35 U.S.C. 154(b) by 100 days.

(21) Appl. No.: 12/918,465

(22) PCT Filed: Feb. 19, 2009

(86) PCT No.: PCT/JP2009/052913
§ 371 (c)(1),
(2), (4) Date: Aug. 19, 2010

(87) PCT Pub. No.: WO2009/104688
PCT Pub. Date: Aug. 27, 2009

(65) Prior Publication Data
US 2011/0006357 A1    Jan. 13, 2011

(30) Foreign Application Priority Data

Feb. 20, 2008    (JP) .................................. 2008-039032

(51) Int. Cl.
*H01L 29/792* (2006.01)
(52) U.S. Cl. ................................. 257/324; 257/E29.309
(58) Field of Classification Search ........... 257/E29.309, 257/324
See application file for complete search history.

(56) References Cited

U.S. PATENT DOCUMENTS

| | | | |
|---|---|---|---|
| 6,462,375 B1 * | 10/2002 | Wu | 257/316 |
| 7,414,889 B2 * | 8/2008 | Lue et al. | 365/185.18 |
| 2005/0085039 A1 * | 4/2005 | Yasui et al. | 438/257 |
| 2008/0073698 A1 * | 3/2008 | Ono | 257/319 |
| 2009/0045452 A1 * | 2/2009 | Lue et al. | 257/321 |

FOREIGN PATENT DOCUMENTS

| | | |
|---|---|---|
| JP | 4-337672 A | 11/1992 |
| JP | 11-284083 A | 10/1999 |
| JP | 2000228510 A | 8/2000 |
| JP | 2003526924 A | 9/2003 |
| JP | 2005294498 A | 10/2005 |
| JP | 2006108620 A | 4/2006 |
| JP | 2007258572 A | 10/2007 |
| JP | 2009054707 A | 3/2009 |

OTHER PUBLICATIONS

International Search Report for PCT/JP2009/052913 mailed Jun. 2, 2009.

* cited by examiner

*Primary Examiner* — Marcos D. Pizarro
*Assistant Examiner* — Sarah Salerno

(57) ABSTRACT

Provided are an architecture for a non-volatile memory device that can increase the write efficiency for split-gate trap memory, as well as increase resistance to disturbances; and a method of manufacturing said memory device. The device includes, at least: a layered film having traps, formed on top of the semiconductor substrate; a memory gate electrode formed on top of the layered film; a word gate electrode laid out so as to contact the memory gate electrode and the substrate through an insulating film; and source and drain regions in the substrate, sandwiching the two gate electrodes. The equivalent oxide thickness of the insulating film sandwiched between the word gate electrode and the substrate is made greater where the layered film is in contact than where there is no contact.

10 Claims, 14 Drawing Sheets

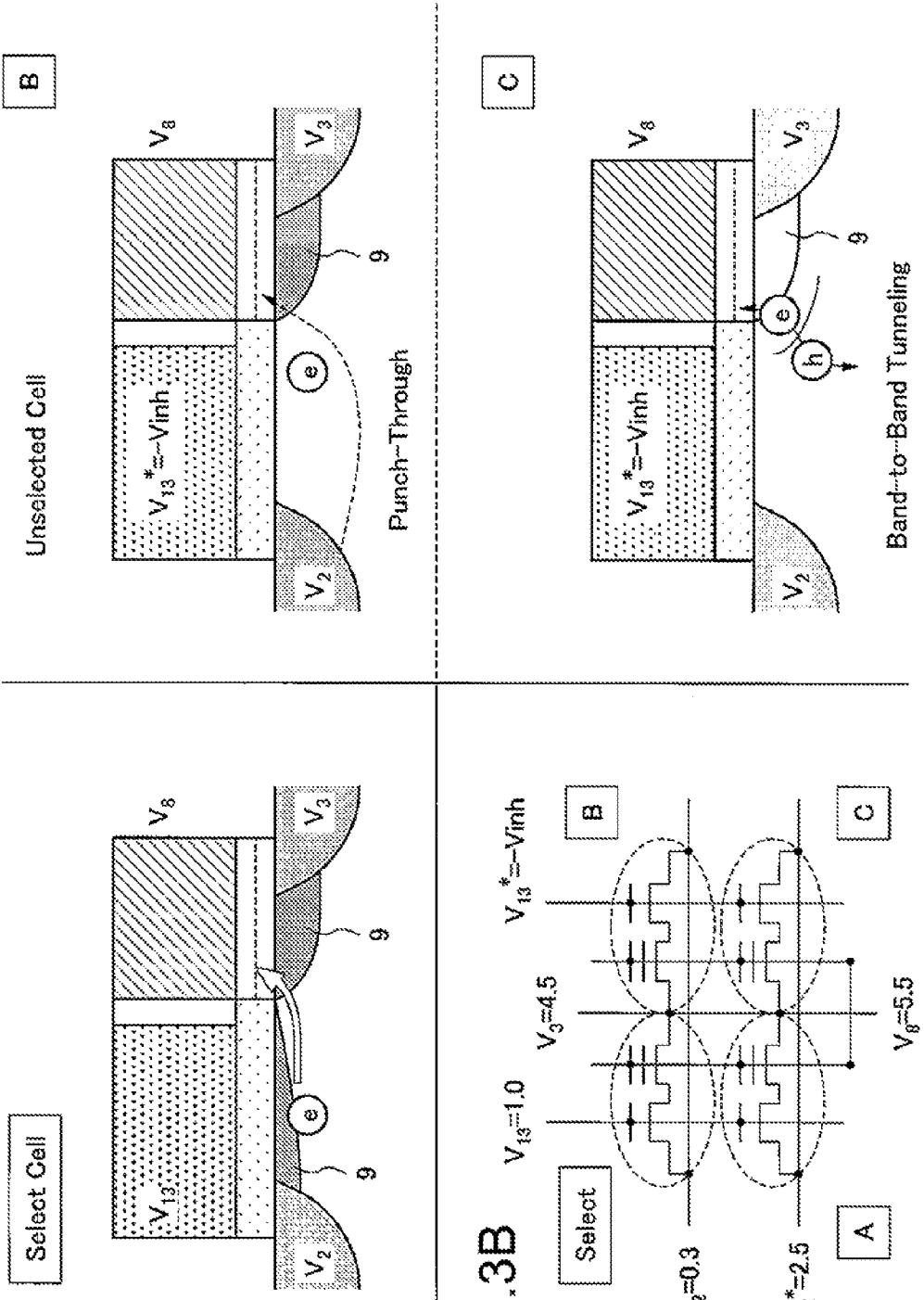

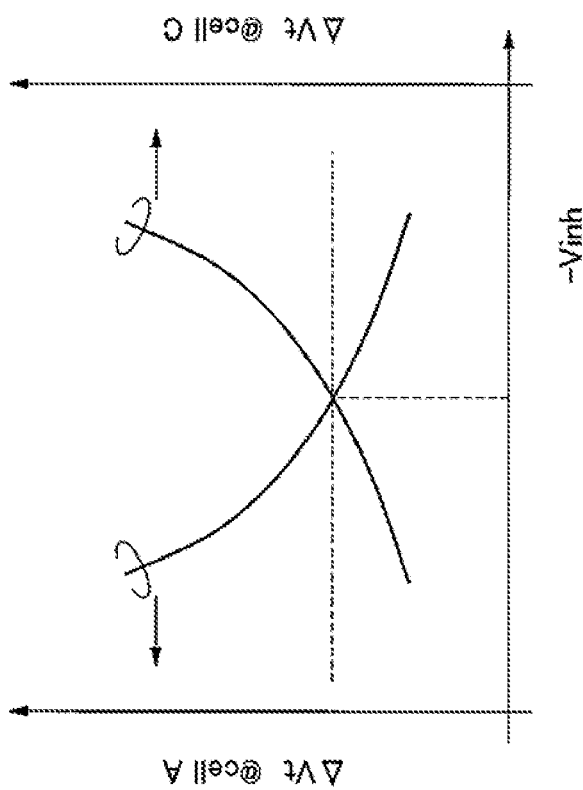
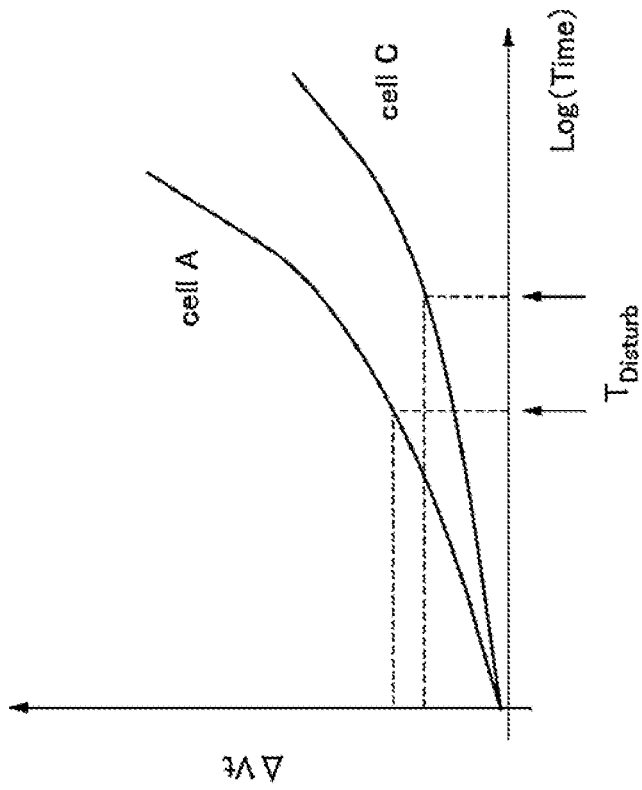
Fig.4A
Fig.4B

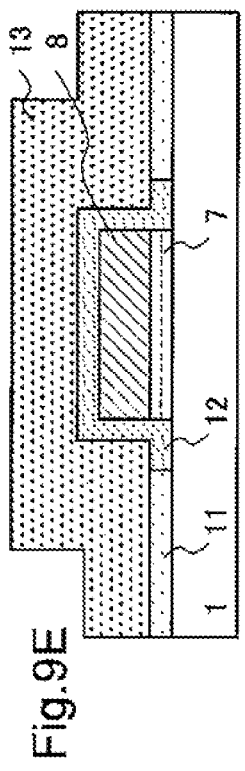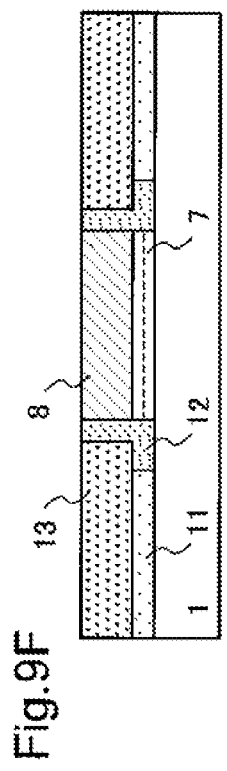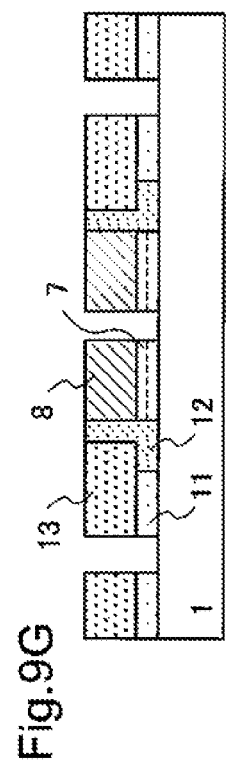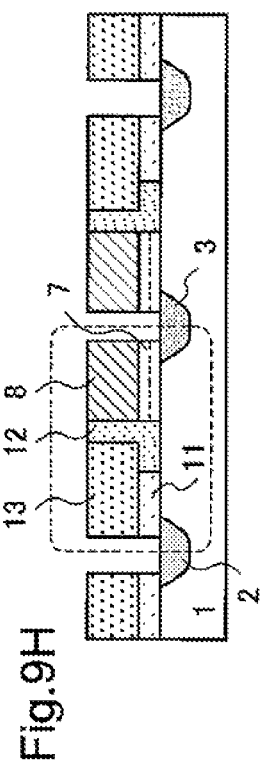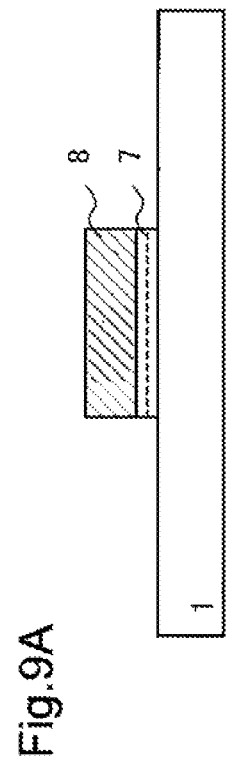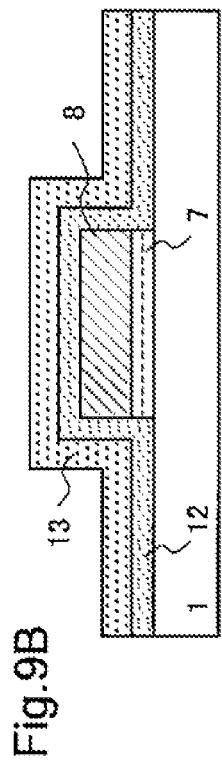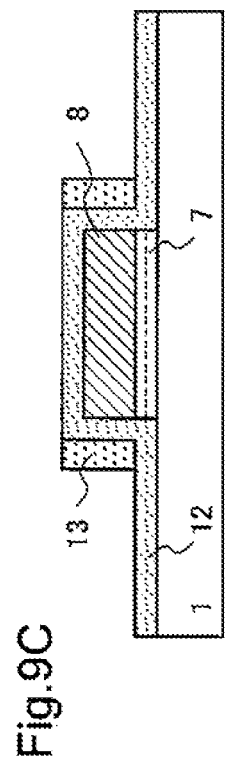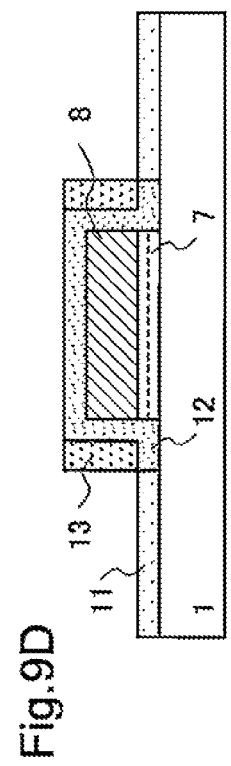

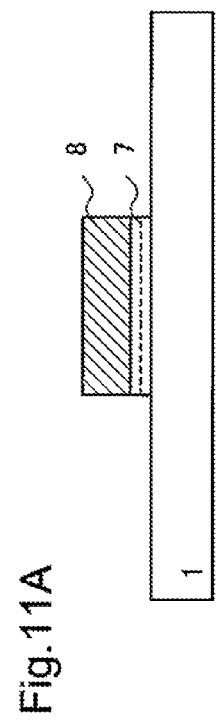
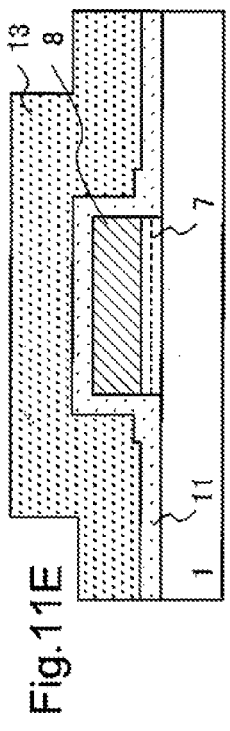
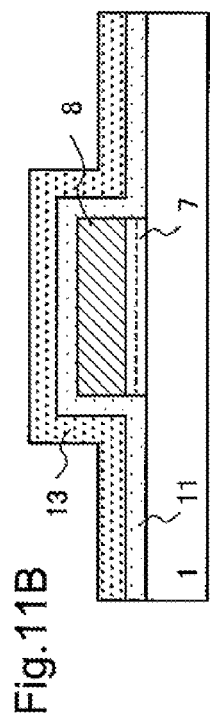
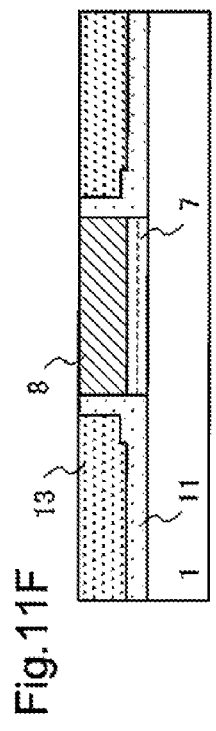
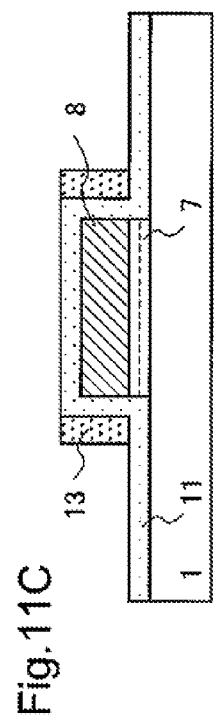
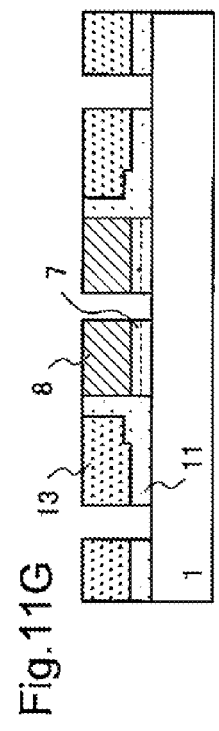
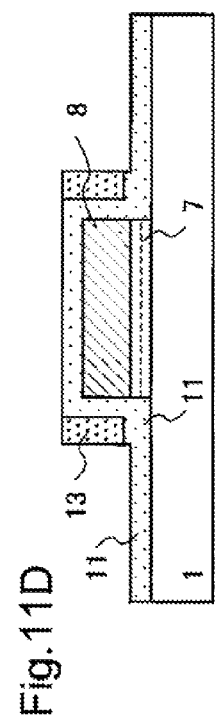
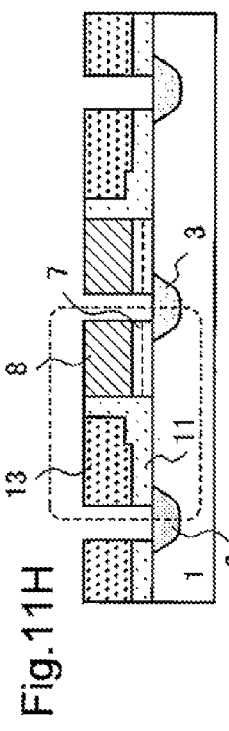

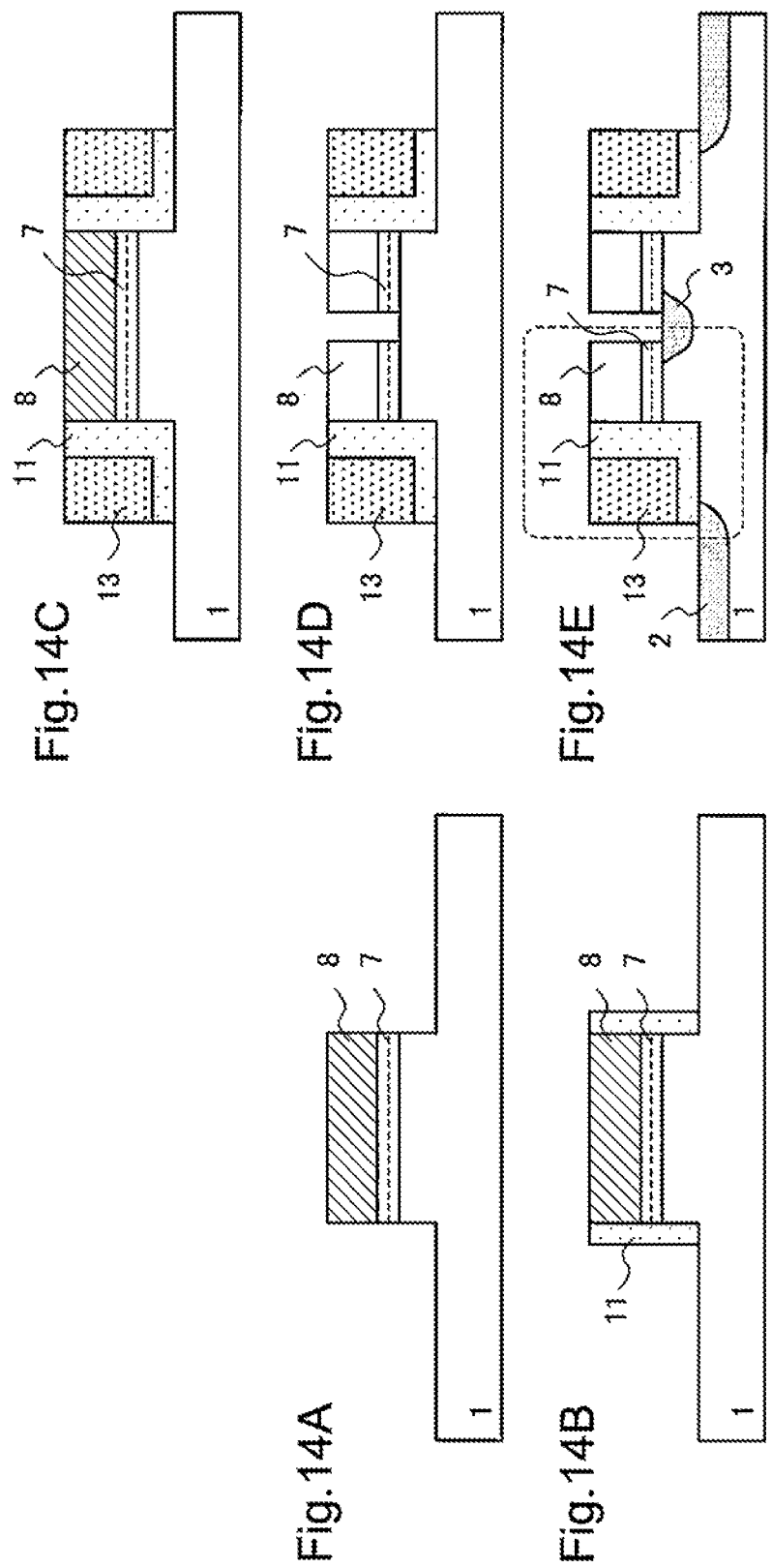

NON-VOLATILE MEMORY DEVICE AND METHOD OF MANUFACTURING SAME

This application is the National Phase of PCT/JP2009/052913, filed Feb. 19, 2009, which is based upon and claims the benefit of priority from Japanese patent application No. 2008-039032, filed on Feb. 20, 2008, the disclosure of which is incorporated herein in its entirety by reference.

TECHNICAL FIELD

The present invention relates to a non-volatile memory device and a method of manufacturing same.

BACKGROUND ART

In recent years, a non-volatile memory device in which stored data is not lost even if an external power supply is switched off has been actively developed. Here, until the 0.13 um generation, a size reduction of a flash memory has been mainly performed by reducing an area of a cell using a floating gate (FG) type or reducing a thickness of an insulating film.

However, after the 90 nm generation, because it has been difficult to reduce the thickness of the insulating film in the light of securing data retention characteristics, a trap type memory has been attracted which utilizes a trap in the insulating film as a charge storage layer.

Hereinafter, structures and operation methods of the trap memories proposed so far are schematically described making reference to drawings.

FIGS. 1A, 1B, 1C, and 1D are drawings illustrating a non-volatile memory device related to the present invention.

FIG. 1A shows a trap memory having the simplest planar type structure (this structure is related to the present invention, hereinafter, this type is represented by "related structure I".). A laminated film 7 composed of a first insulating film 4, a charge storage layer 5 and a second insulating film 6 in this order is provided on a silicon substrate 1 and a memory gate electrode 8 is provided on the laminated film 7. On the both sides by which the memory gate electrode 8 is sandwiched in the silicon substrate 1, a source region 2 and a drain region 3 are formed so that the each region and the memory gate electrode 8 are partially overlapped.

In writing data, it is used that a channel hot electron, which is raised up a high energy state by a strong lateral electric field generated at a boundary of an inversion channel region 9 when a positive voltage is applied to the memory gate electrode 8 and the drain 3 as shown in FIG. 1B, is injected into the charge storage layer 5 in the laminated film 7.

On the other hand, in erasing data, the electron captured in the charge storage layer 5 is pulled out with a negative voltage applied to the memory gate electrode 8 by utilizing a Fowler-Nordheim (FN) type tunnel phenomenon. Or alternatively, by means of injecting into the charge storage layer 5 a band-to-band tunneling hot-hole which is generated by applying a positive voltage to the drain 3 in addition to applying a negative voltage to the memory gate electrode 8, the electron captured in the charge storage layer 5 is neutralized. Because a change in amount of electric charge stored in the charge storage layer 5 causes a change in the threshold value of the memory gate electrode 8, the information (data) on the amount of stored electric charge can be read out by using the change in the threshold value.

The related structure I shown in FIG. 1A has a problem that it is difficult to improve a writing efficiency. This is because a channel current flowing from the source to the drain increases by contraries due to the decrease in the resistance in a channel direction, when the channel hot electron becomes easy to be injected into the charge storage layer 5 by applying the high electric field to the memory gate electrode 8, whereby strengthening the vertical electric field from the gate crossing the charge storage layer 5 to the silicon substrate 1.

For this reason, the writing efficiency (a value obtained by dividing an amount of the channel hot electron injected into the charge storage layer per unit time by the channel current flowing from the source to the drain) does not increase, but decreases by contraries, even if the gate voltage is increased.

In order to solve the problem on the related structure I, a trap memory having a split gate type structure (hereinafter, this type is represented by "related structure II".) is proposed.

As shown in FIG. 1C, the laminated film 7 composed of the first insulating film 4, the charge storage layer 5, and the second insulating film 6 in this order and the memory gate electrode 8 are provided on the silicon substrate 1. A word gate electrode 13 is arranged on insulating films 10 and 11 so as to contact with both one side of the memory gate electrode 8 and one of principal surfaces (upper surface in the figure) of the silicon substrate 1. On the both sides by which the gate electrodes 8 and 13 are sandwiched in the silicon substrate 1, the source region 2 and the drain region 3 are formed so that the source region 2 and the drain region 3 partially overlaps with the gate electrode 8, 13 respectively.

In writing the data, the strong lateral electric field generated at the boundary of the inversion channel region is utilized as well as the case of the simple planar structure (related structure I).

However, it is necessary that the injection of the electron is made easy by applying the strong vertical electric field to the memory gate 8 on the charge storage layer 5 and on the other hand, the channel current is kept not flowing excessively by increasing the resistance under the word gate 13 holding the voltage applied to the word gate 13 lower (FIG. 1D).

Because the vertical electric field crossing the charge storage layer 5 can be strengthened with suppressing the current flowing from the source to the drain, the electron can be injected into the charge storage layer 5 with higher efficiency by one or more orders than that of the related structure I.

Since the split gate structure is superior in writing efficiency for this reason, it is an important structure particularly for a logic LSI with a built-in memory which has large effect on chip cost reduction by reducing an area of a peripheral circuit.

In the trap memory having the split gate type structure (related structure II), there is another structure shown in FIG. 2A further improving the writing efficiency. As shown in FIG. 2A, it is a structure in which a dopant concentration in a portion contacting with the memory gate 8 under the word gate 13 is made high, and a low channel resistance region $\alpha$ (low threshold value region $\alpha$) and a high channel resistance region $\beta$ (high threshold value region $\beta$) are further produced in the channel under the word gate 8. This structure is represented by "related structure II'".

FIG. 2A and FIG. 2B are views for illustrating an operation of a non-volatile memory device related to the present invention. Even if the channel currents for writing are made equal to each other, the region $\alpha$ has the lower resistance (FIG. 2B), a voltage drop from the source to the drain is the more highly concentrated in the high resistance channel region $\beta$ near the memory gate 8. For that reason, the channel electron becomes easily accelerated (can easily become hot). Therefore, the writing efficiency in the related structure II' is further improved than that of the related structure II.

In the split gate type structure (related structure II), the above-mentioned partially doped structure (related structure II') has a merit improving the writing efficiency. On the other hand, when the writing operation is actually performed to memory cells arranged in an array, it has been observed that its disturbing resistance to an adjacent cell is deteriorated in comparison with that of the related structure II before it is improved.

Therefore, first, the disturbance is described by using FIG. 3 and FIG. 4, and then, a problem on the related structure II' is described. The memory cells are arranged in an array (for example, 16×16 cells) so as to be efficiently arranged in a chip. FIGS. 3A, 3B, and 3C are views for illustrating a non-volatile memory device related to the present invention. FIGS. 4A and 4B are views for illustrating a characteristic of a non-volatile memory device related to the present invention. FIG. 4A shows a relationship between a time and a change in voltage of each cell, and FIG. 4B shows a relationship between a threshold value and a change in voltage of each cell.

When the voltage is applied to the cell for writing (FIG. 3A), the voltage is also applied to each electrode of an adjacent cell (unselected cell) through a common wiring as shown in FIG. 3B. Because the electron in the substrate is injected into the charge storage layer in the unselected cell by the stress caused by the external voltage, when the unselected cell is in an erased state in particular, an erasure level (a threshold value) increases and the memory window is narrowed (this is called a disturbance problem).

An arrangement of a voltage applied to the unselected cell can be categorized into three, that is, A, B, and C shown in FIG. 3B. It is assumed that the writing operation is performed to almost all the cells in the array of 16×16, for example. In this case, a time during which the stress is added (disturbing time: T_disturb) in each voltage arrangement is "writing time"×15 in the case of A and B, and "writing time"×15×15 in the case of C.

In case of the voltage arrangement A, the voltage difference between the source and the drain (V3−V2*) is small, and a voltage that is equal to or greater than the threshold value at which the inversion layer is formed is applied to the word gate (V13) and the memory gate (V8). Therefore, the electric field does not sharply decrease in the channel and the hot electron is scarcely generated. For this reason, the variation of the threshold value in the disturbing time is negligible small in the voltage arrangement A.

On the other hand, in case of the voltage arrangements B and C, the channel current does not flow by a negative voltage (this is called an inhibit voltage—Vinh) that is applied to the word gate. In contrast, there is a high electric field drop in the substrate under the word gate near the memory gate. For this reason, as shown in FIG. 3C, the hot electron is generated by a sub-threshold current such as a punch-through current or a band-to-band (between a valence band and a conduction band) tunneling current, and the electron flows into the charge storage layer 5. The sub-threshold current increases with the reduction in size of the memory cell, and the variation of the threshold value in the disturbing time becomes so large that it cannot be ignored with respect to a voltage stress of the voltage arrangements B and C (FIG. 4A).

The disturbance is described in detail in the case of the voltage arrangements B and C. A major factor in varying the threshold value of the cell in the voltage arrangement B is the punch-through current flowing inside the substrate. For this reason, as shown in FIG. 4B, when the negative inhibit voltage applied to the word gate is reduced, the variation of the threshold value of the cell in the voltage arrangement A increases.

On the other hand, in case of the voltage arrangement C, because the positive voltage (V2*) is applied to the source electrode, the punch-through current is smaller than that of the voltage arrangement B. However, because the disturbing time (T_disturb) is long, a phenomenon, that is, the hot electron generated by the band to band tunneling in the substrate under the word gate near the memory gate directly flows into the charge storage layer 5, cannot be ignored.

Accordingly, as shown in FIG. 4B, when the negative inhibit voltage applied to the word gate is increased, the variation of the threshold value of the cell in the voltage arrangement C increases. Because the dependence on the inhibit voltage for the variation of the threshold value in the voltage arrangement B is inverse relation to that in the voltage arrangement C, the inhibit voltage for writing is set so that a sum of the variation of the threshold value in the voltage arrangement B and that in the voltage arrangement C becomes a minimum. When this minimum value is used as an index of the disturbance resistance, the smaller this value is, the higher the disturbance resistance is.

In FIG. 5, the disturbance resistance of the related structure II', whose writing efficiency is improved by increasing the channel doping concentration in the region β contacting with the laminated film in the word gate, is shown compared with that of the related structure II. In this figure, the horizontal axis represents the threshold value—Vinh, and the left and right vertical axes represent the change of voltage in each cell. Because the doping amount does not change near the source region or at the deep position in the substrate and whereby the reduction in punch-through current is limited, the variation of the threshold value in a stress voltage arrangement A of the related structure II' is small, if any.

On the other hand, because the electric field strength in the substrate near the memory gate under the word gate increases due to the influence of the channel doping to the region β, the band-to-band tunneling current generated near the memory gate under the word gate increases considerably. For this reason, the variation of the threshold value in the stress voltage arrangement C enlarges widely. As shown in FIG. 5, the minimum value of the sum of the disturbance variation in a cell arrangement B and that in a cell arrangement C of the related structure II' is increased in comparison with that of the related structure II (that is, the disturbance resistance is deteriorated).

Here, examples of the non-volatile memory devices are described in the patent documents 1 to 3.

A non-volatile semiconductor memory device described in the patent document 1 includes a floating gate formed on a silicon substrate with one conductivity type, an insulating film for covering this floating gate, a control gate formed so as to have an overlapped area on the floating gate with the insulating film interposed therebetween. Moreover, it is provided with a diffusion region with an opposite conductivity type formed on the surface of the silicon substrate adjacent to the floating gate and the control gate, and a metal wiring connected to the diffusion region on an interlayer insulating film. In this non-volatile semiconductor memory device, the metal wiring is formed with a silicide film on one surface of the diffusion region and the metal wiring is formed without a silicide film on the other surface of the diffusion region.

According to this non-volatile memory device, in a state in which an anti-silicidation film composed of an LPTEOS film is formed in a portion in which silicidation is not performed, a titanium film is formed, by means of forming a titanium film, and performing the silicidation by adding a heat treatment, the reaction between a base Si (source region) and the titanium film is supposed to be suppressed.

A split gate type non-volatile semiconductor memory device described in the patent document 2 includes a floating gate having an acute-angled portion formed from a side and an upper part, a control gate arranged so as to face the acute-angled portion, and an insulating region provided on the upper part of the floating gate, on a substrate respectively. In this split gate type non-volatile semiconductor memory device, the side corresponding to a control gate side among the sides of the insulating region inclines to a direction apart from the control gate using a normal direction on the substrate as a standard.

In the split gate type non-volatile memory, data erasure is performed by pulling out the electron from the floating gate to the control gate. According to the split gate type non-volatile semiconductor memory device described in the patent document 2, a non-volatile memory which can properly and stably perform the operation of data erasure, can be configured A non-volatile semiconductor memory device described in the patent document 3 includes a floating gate formed on one conductivity type silicon substrate with a gate oxide film, a tunnel oxide film covering the floating gate, a control gate formed so that it overlaps with one end portion of the floating gate with a tunnel oxide film between them. And it includes an opposite conductivity type source/drain region formed on the surface of the semiconductor substrate adjacent to the floating gate and the control gate. In this device, a side wall insulating film is formed on only the portion which covers near the lower portion of the floating gate with the tunnel oxide film.

According to the non-volatile semiconductor memory device, a side wall insulating film is formed at the portion in which the tunnel oxide film covering the floating gate on the silicon substrate covers the vicinity of the lower portion of the floating gate. And the control gate is formed over the side wall insulating film so that one end portion of the floating gate and the control gate overlap. Therefore, a corner portion of the control gate does not enter a floating gate side sharply at a lower corner portion of the floating gate at which the reverse tunneling is likely to arise. Moreover, the interval between the control gate and the floating gate of which the word line is composed does not narrow, and the occurrence of the reverse tunneling failure can be suppressed.

Patent document 1: Japanese Patent Application Laid-Open No. 2000-228510
Patent document 2: Japanese Patent Application Laid-Open No. 2007-258572
Patent document 3: Japanese Patent Application Laid-Open No. Hei 11-284083

DISCLOSURE OF INVENTION

Problems to be Solved by the Invention

However, there is room for improvement of the writing efficiency or the disturbance resistance with respect to the technologies described in the patent documents 1 to 3. Accordingly, the present invention has been contrived considering the above-mentioned problems in the related structures.

That is, the object of the present invention is to provide a structure of a non-volatile memory device and a method of manufacturing the same by which a writing efficiency can be improved and the disturbance resistance can also be improved in a trap memory having a split gate structure.

Means for Solving the Problems

A device of the present invention is characterized in that the device is formed on a substrate and at least includes a laminated film storing an electric charge, a first gate electrode formed on the laminated film, a second gate electrode formed so as to contact with the first gate electrode and the substrate with a first insulating film and a second insulating film interposed therebetween, respectively, and a first and a second impurity diffusion layer formed in the substrate so as to sandwich the first gate electrode and the second gate electrode and an equivalent oxide thickness of the second insulating film in a part contacting with the laminated film is greater than that of the second insulating film in a part not contacting with the laminated film.

Here, the equivalent oxide thickness is a film thickness which an insulating film needs to be in order to get the same capacitance as the silicon oxide film.

A first method of the present invention is characterized by including a step in which a semiconductor substrate is prepared, a step in which a tunnel insulating film material, a charge storage layer material and a gate electrode material are deposited in order on one of principal surfaces of the semiconductor substrate, a step in which the semiconductor substrate is exposed by removing a part of the gate electrode material, a part of the charge storage layer material, and a part of the tunnel insulating film material, a step in which an insulating film material is deposited on one of principal surfaces of the semiconductor substrate, a step in which the gate electrode material is deposited on one of principal surfaces of the semiconductor substrate, and then the gate electrode material is left by etching back on a side of the gate electrode formed by the step above, a step in which a dielectric constant of the insulating film material formed on the semiconductor substrate without being etched back is increased, a step in which a gate electrode material is deposited on one of principal surfaces of the semiconductor substrate, a step in which an upper part of each gate electrode is exposed by etching, a step in which a predetermined part of the gate electrode material, the insulating film material, the charge storage layer material, and the tunnel insulating film material is removed and the semiconductor substrate is exposed, and a step in which a diffusion layer is formed in the semiconductor substrate.

A second method of the present invention is characterized by including a step in which a semiconductor substrate is prepared, a step in which an insulating film material and a gate electrode material are deposited on one of principal surfaces of the semiconductor substrate, a step in which the semiconductor substrate is exposed by removing a part of the insulating film material and a part of the gate electrode material, a step in which a bird's beak is introduced by oxidation in a portion of an insulating film sandwiched between the gate electrode and the semiconductor substrate, a step in which a tunnel insulating film material, a charge storage layer material, and a gate electrode material are deposited in order on one of principal surfaces of the semiconductor substrate, a step in which an upper part of each gate electrode is exposed by etching, a step in which a predetermined part of a gate material, the insulating film material, the charge storage layer material, and the tunnel insulating film material is removed and the semiconductor substrate is exposed; and a step in which a diffusion layer is formed in the semiconductor substrate.

A third method of the present invention is characterized by including a step in which a semiconductor substrate is prepared, a step in which a tunnel insulating film material, a charge storage layer material, and a gate electrode material are deposited in order on one of principal surfaces of the semiconductor substrate, a step in which a predetermined part of the gate electrode material, the charge storage layer material, and the tunnel insulating film material is removed, a step in which a part of one of principal surfaces of the semiconductor substrate is removed by etching continuously and the semiconductor substrate is made convex, a step in which an insulating film material is deposited on one of principal surfaces of the semiconductor substrate, and then the insulating film material is left on sides of the gate electrode and the substrate with convex shape by etching back, a step in which an insulating film material and a gate electrode material are deposited on one of principal surfaces of the semiconductor substrate, and then the gate electrode material is left on a side of the gate electrode formed above by etching back, a step in which a predetermined part of the gate electrode material, the charge storage layer material, and the tunnel insulating film material is removed and the semiconductor substrate is exposed, and a step in which a diffusion layer is formed in the semiconductor substrate.

Effect of the Invention

In the present invention, because the equivalent oxide thickness of the insulating film under the gate electrode is greater than that of the insulating film that also exists under the gate electrode, the threshold value of the region under the insulating film is greater than that of the region under the insulating film. Therefore, the writing efficiency and the disturbance resistance can be improved.

BEST MODE FOR CARRYING OUT THE INVENTION

Hereinafter, the present invention is described in detail according to an example.

(Feature)

A non-volatile memory device according to the present invention includes at least a laminated film which is formed on a semiconductor substrate and has a function to store an electric charge, a first gate electrode formed on the laminated film, a second gate electrode formed so as to contact with the first gate electrode and the semiconductor substrate with a first insulating film and a second insulating film interposed therebetween, respectively, a first and a second diffusion layer formed in the semiconductor substrate so as to sandwich the first gate electrode and the second gate electrode. And in the device, an equivalent oxide thickness of the second insulating film in a part contacting with the laminated film is greater than that of the second insulating film in a part not contacting with the laminated film.

In other words, this non-volatile memory device includes at least a substrate, a first and a second impurity diffusion layer formed near a principal surface in the substrate so as to face each other, an insulating film formed on the substrate from the first impurity diffusion layer toward the second impurity diffusion layer, a laminated film storing electric charge formed on the substrate from the second impurity diffusion layer toward the first impurity diffusion layer, the other insulating film formed between the insulating film and the laminated film on the substrate, a first gate electrode formed on the laminated film, the yet another insulating film formed on a side wall of the first gate electrode, and a second gate electrode formed on the insulating film and the other insulating film and formed so that its side wall further contacts with the yet another insulating film. And in the device, an equivalent oxide thickness of the other insulating film in a part contacting with the laminated film is greater than that of the other insulating film in a part not contacting with the laminated film.

(Structure)

FIG. 6 shows a top view of one exemplary embodiment of a non-volatile memory device according to the present invention.

As shown in FIG. 6, in a trap type memory as a non-volatile memory device according to the present invention, a linear isolation region 15 is arranged in a plurality of predetermined regions of the semiconductor substrate 1 and active regions (a first impurity diffusion region, a second impurity diffusion region, a channel region, and the like) are insulated and isolated from each other. In addition, both an N-type semiconductor (N well) and a P type semiconductor (P well) can be available for the semiconductor substrate.

A plurality of linear electrodes is arranged on the semiconductor substrate I extending in a predetermined direction 16. Further, one linear electrode is composed of two electrodes of the electrode 8 and the electrode 13 contacting with each other with the insulating film 10 interposed therebetween. The laminated film 7, which is composed of the insulating film (tunnel insulating film) 4, the charge storage layer 5, and the insulating film 6 in this order from the semiconductor substrate 1, is arranged between the linear electrode 8 and the semiconductor substrate 1. An insulating film 11 and an insulating film 12 are arranged adjacently extending in the predetermined direction 16 between the linear electrode 13 and the semiconductor substrate 1. The insulating film 12 represents one contacting with the laminated film 7.

A conductive material having desired electrical conductivity and work function can be utilized as a gate electrode material, for example, an impurity-doped semiconductor such as impurity-doped polycrystalline silicon, polycrystalline SiGe, polycrystalline Ge, polycrystalline SIC or the like, a metal such as Mo, W, Ta, Ti, Hf, Re, Ru or the like, a metal nitride such as TiN, TaN, HfN, WN, or the like, and a silicide compound such as cobalt silicide, nickel silicide, platinum silicide, erbium silicide, or the like.

Not only a single crystal film but also a layered structure such as a laminated film composed of a semiconductor and a metallic film, a laminated film composed of metallic films, a laminated film composed of a semiconductor and a silicide film, or the like can be available for a structure of the gate electrode.

A pair of source/drain region (a first impurity diffusion region and a second impurity diffusion region) 2 and 3 are arranged so as to face each other at the both sides in the semiconductor substrate 1 sandwiched in a direction 17 perpendicular to the direction 16 in which each linear electrode composed of the gate electrode 8 and the gate electrode 13 extends. Either the N-type impurity or the P-type impurity may be injected into the source/drain regions 2 and 3 and it is appropriately selected according to whether the semiconductor substrate, which composes the device of the present invention, has a N type well or a P type well.

The source/drain regions arranged so as to sandwich each linear electrode are arranged in alignment in the direction 17 perpendicular to the direction 16 in which the linear electrode extends, and a plurality of straight lines on which such source/drain regions are arranged are provided so as to be parallel to each other. A source drain contact 14 is arranged in the source/ drain region provided at the both sides of each linear electrode in order to apply a voltage, and this contact 14 is electrically connected to the wiring layer.

FIG. 7A is a cross sectional view taken along the line Ia-Ia in one exemplary embodiment of a non-volatile memory device according to the present invention shown in FIG. 6, and FIG. 7B is a cross sectional view taken along the line Ib-Ib in FIG. 6. As shown in FIG. 7A and FIG. 7B, the laminated films 7 composed of the insulating film 4, the charge storage layer 5, and the insulating film 6, an insulating film 12 contacting with one side of the laminated film 7, and the laminated film 11 contacting with the side of the insulating film 12 that does not contact with the laminated film 7 are formed on the semiconductor substrate 1 having the isolation region 15.

The gate electrode 8 is formed on the laminated film 7 and the gate electrode 13 is formed on the insulating film 11 and the insulating film 12. The insulating film 10 is formed between the gate electrode 8 and the gate electrode 13, and the gate electrode 8 and the gate electrode 13 are electrically isolated from each other. The source region 2 and the drain region 3 are formed in the semiconductor substrate 1 so that a part of them overlaps with the gate electrode 8 or the gate electrode 13.

The non-volatile memory device according to the present invention has a feature that the equivalent oxide thickness of the insulating film 12 existing under the gate electrode 13 is greater than that of the insulating film 11 also existing under the gate electrode 13.

(Operation Method)

In the non-volatile memory device according to the present invention, in writing data, the hot electron is generated by applying a positive voltage to the gate electrodes 8, 13 and the drain region 3, and this hot electron it is injected into the charge storage layer under the gate electrode 8. In reading out data, a positive voltage is applied to the source region 2 and the gate electrodes 8, 13 and a source current value is monitored.

When the electron is stored in the charge storage layer, because a flat band in the charge storage layer shifts in the positive direction, it becomes difficult for the current to flow in comparison with a case in which the electron is not stored in the charge storage layer. In this way, by binarizing the state in which it is difficult or easy for the current to flow, it becomes possible to store the information.

In order to delete the stored information, by utilizing a Fowler-Nordheim (FN) type tunneling current with a negative voltage applied to the gate electrode 8, the electron is deleted from the charge storage layer. It is also possible to neutralize the electron existing in the charge storage layer by means of injecting a hole generated by band-to-band tunneling in the substrate 1 into the charge storage layer with a negative voltage applied to the gate electrode 8, and a positive voltage applied to the drain region 3.

(Effect)

In the non-volatile memory device, the equivalent oxide thickness of the insulating film 12 existing under the gate electrode 13 is greater than that of the insulating film 11 also existing under the gate electrode 13. Therefore, the threshold value of the region β under the insulating film 12 is greater than that of the region α under the insulating film 12. For this reason, even if the current for writing (channel current) is the same, it becomes difficult for the voltage drop from the source to the drain to arise in the region α with low channel resistance, in comparison with the related structure II in which the equivalent oxide thickness of the insulating film existing under the gate electrode 13 is constant in plane. Because the voltage drop is concentrated all the more in the high resistance region β near the charge storage layer 5, the electron in the channel is easily accelerated (easily become hot) and the electron injection efficiency into the charge storage layer is improved. That is, the writing efficiency is improved. Here, the writing efficiency means a value obtained by dividing an amount of the channel hot electron injected into the charge storage layer per unit time by the channel current flowing from the source to the drain.

Because the electric field applied to the substrate 1 from the gate electrode 13 near the memory gate is lowered due to the large equivalent oxide thickness of the insulating film 12 contacting with the memory gate, the band-to-band tunneling current generated near the memory gate (region β) under the word gate can be suppressed.

This reason is described below using FIG. 8. FIG. 8 is a schematic diagram for illustrating a non-volatile memory device according to the present invention, the horizontal axis represents the threshold value voltage—Vinh, and the left and right vertical axes represent the change in voltage of each cell. As shown in FIG. 8, the variation of the threshold value within the disturbing time in the unselected cell C in writing operation shown in FIG. 3C can be reduced in comparison with the case of the related structure II. Here, the related structure II is the structure in which the equivalent oxide thickness of the insulating film under the gate electrode 13 is constant in plane (=an average value of the insulating film 11 and the insulating film 12).

Because the equivalent oxide thickness of the insulating film 11 contacting with the source region is small, the electric field applied to the substrate 1 from the gate electrode 13 near the source region is strengthened. Therefore, the punch-through current, which is generated by combining a depletion layer of the source side and a depletion layer of the drain side near the source region, can be efficiently suppressed. For this reason, as shown in FIG. 8, the variation of the threshold value within the disturbing time in the unselected cell B in writing operation shown in FIG. 3C can be reduced in comparison with the case of the related structure II. Here, the related structure II is the structure in which the equivalent oxide thickness of the insulating film under the gate electrode 13 is constant in plane (=an average value of the insulating film II and the insulating film 12).

As shown in FIG. 8, the disturbance variation of both a cell arrangement B and a cell arrangement C can be reduced in comparison with the case of the related structure II in which the equivalent oxide thickness of the insulating film under the gate electrode 13 is constant in plane. That is, the minimum value of the sum of the disturbance variation in the cell arrangement B and the cell arrangement C can be efficiently reduced, which means that the disturbance resistance can be improved.

In the non-volatile memory device according to the present invention, the laminated film having a function to store the electric charge includes at least two layers which consist of the charge storage layer and the tunnel insulating film in order from the gate electrode side. For example, a two-layer structure including the charge storage layer and the tunnel insulating film, or a three-layer structure including the insulating film B, the charge storage layer, and the tunnel insulating film, can be available as the laminated film. In this case, it is desirable that a silicon nitride film, an oxynitride silicon film, an alumina film, a hafnium silicate film, a hafnium oxide silicate film, or an aluminum silicate film is used as the charge storage layer.

It is preferable that the silicon oxide film or the oxynitride silicon film is used for the tunnel insulating film. By using these charge storage layer and these tunnel insulating film, the high electric charge retention property can be obtained. For the same reason mentioned above, when the insulating film B is used, the same material as the tunnel insulating film can be available.

In light of electric charge retention, it is preferable that a thickness of the tunnel insulating film is equal to or more than 25 nm at which a tunneling mechanism does not become a direct tunneling mechanism in which the electron penetrates, it is further preferable that a thickness is equal to or more than 35 nm, and furthermore, it is much preferable that a thickness is equal to or more than 45 nm.

And it is preferable that a thickness of the insulating film B is equal to or more than 25 nm at which a tunneling mechanism does not become a direct tunneling mechanism in which the electron penetrates, it is further preferable that a thickness is equal to or more than 35 nm, and furthermore, it is much preferable that a thickness is equal to or more than 45 nm.

In order to prevent the electron injected into the charge storage layer from moving easily in the charge storage layer, it is preferable that an electrical conductivity of a dielectric material (insulating material) used as a material for the charge storage layer is equal to or lower than $10^{-6}$ (S/m) at room temperature, it is further preferable that an electrical conductivity is equal to or lower than $10^{-8}$ (S/m), and furthermore, it is much preferable that an electrical conductivity is equal to or lower than $10^{-10}$ (S/m).

In order to generate the acceleration of the channel hot electron intensively near the charge storage layer in writing, with respect to a ratio of the equivalent oxide thickness of the insulating film under the word gate electrode 13 contacting with the laminated film having a function to store the electric charge to that not contacting with the laminated film, it is preferable that the former is lager than the latter, and it is preferable that the ratio is 6 to 4, it is further preferable that the ratio is 7 to 3, and furthermore, it is much preferable that the ratio is 8 to 2.

In order to generate the acceleration of the channel hot electron intensively near the charge storage layer in writing, with respect to a ratio of an occupied length in a channel direction of a region having a large equivalent oxide thickness to that region having a small equivalent oxide thickness, it is preferable that the latter is lager than the former, and it is preferable that the ratio is 3 to 7, it is further preferable that the ratio is 2 to 8, and furthermore, it is much preferable that the ratio is 1 to 9.

On the other hand, it is preferable that a channel width in the region with a large equivalent oxide thickness (a distance from the end of the storage layer to the boundary of the region with a small equivalent oxide thickness) is longer than a distance required for the acceleration of the channel electron by a lateral electric field to become hot in writing, and it is preferable that the channel width is equal to or more than 5 nm, it is further preferable that the channel width is equal to or more than 10 nm, and furthermore, it is much preferable that the channel width is equal to or more than 15 nm.

It is not necessary that the source region and the drain region are arranged at the same level in the substrate and also it is not necessary that the channel is formed on the same plane in the substrate. Accordingly, a structure may be used in which the level of the boundary plane between the insulating film 11 and the substrate 1 is lower than the level of the boundary plane between the laminated film 7 and the substrate 1, and the insulating film 12 is L-shaped and contacts with the insulating film 11 and the laminated film 7 at the both ends thereof.

A method of manufacturing a non-volatile memory device of the present invention has the following steps:

(1) a step in which a semiconductor substrate is prepared, (2) a step in which a tunnel insulating film material, a charge storage layer material and a gate electrode material are deposited in this order on one of principal surfaces of the semiconductor substrate, (3) a step in which a part of the gate electrode material, a part of the charge storage layer material and a part of the tunnel insulating film material are removed to expose the semiconductor substrate, (4) a step in which the insulating film material is deposited on one of principal surfaces of the semiconductor substrate, (5) a step in which the gate electrode material is deposited on one of principal surfaces of the semiconductor substrate, and then the gate electrode material is left by an etching back process on a side of the gate electrode formed by the step above, (6) a step in which the dielectric constant of the insulating film material formed on the semiconductor substrate without being etched back is increased, (7) a step in which the gate electrode material is deposited on one of the principal surfaces of the semiconductor substrate, (8) a step in which an upper part of each gate electrode is exposed by etching, (9) a step in which the predetermined part of the gate electrode material, the insulating film material, the charge storage layer material and the tunnel insulating film material is removed to expose the semiconductor substrate, and

(10) a step in which a diffusion layer is formed in the semiconductor substrate.

An example of the method of manufacturing the trap type memory as the non-volatile memory device according to the present invention is briefly described below.

The drawings from FIG. 9A to FIG. 9H are process charts showing a manufacturing method of a trap type memory as a non-volatile memory device. The drawings from FIG. 9A to FIG. 9H show cross sectional views of the trap type memory taken along the line IIa-IIa shown in FIG. 10.

FIG. 9A: First, the oxide film (tunnel insulating film material) 4 and the nitride film (charge storage layer material) 5 are deposited in this order on the surface of the P type semiconductor substrate 1 by using a CVD (Chemical Vapor Deposition) method, an oxide film (insulating film B material) 6 is formed by oxidizing an upper part of the nitride film 5 by using ISSG (In-site Steam Generation), and whereby the laminated film 7 composed of the oxide film 4, the nitride film 5 and the oxide film 6 is formed.

Next, a phosphorus doped silicon film (gate electrode material) 8 is deposited on the oxide film 6 of the laminated film 7 by using the CVD method. An anti-reflection film and a resist film are deposited, patterned by exposure and development, and a predetermined portion of the semiconductor substrate 1 is exposed by etching the gate electrode material 8 and the laminated film 7 by using the dry etcher, and then the anti-reflection film and the resist film are removed by a wet removing process.

FIG. 9B: Next, the oxide film 12 and the phosphorus doped silicon 13 are deposited on one of principal surfaces (upper side surface in the figure) of a wafer by using the CVD method.

FIG. 9C: Next, the gate electrode material 13 is etched back by the dry etching so as to be left only on the both side walls of the gate electrode material 8.

FIG. 9D: Next, the dielectric constant in the oxide film on the substrate 1 is improved by injecting nitrogen ions into it with low energy, and then, the damage caused by the injection is recovered by annealing process.

FIG. 9E: Next, the phosphorus doped silicon is deposited on a whole area of one principal surface (upper side surface in the figure) of the wafer.

FIG. 9F: Next, a part of the gate electrode material 13 and a part of the oxide film 12 are removed by a CMP (Chemical Mechanical Polishing) process, and then, an upper end portion of the gate electrode material 8 is exposed.

FIG. 9G: Next, the anti-reflection film and the resist film are deposited, patterned by exposure and development, and a predetermined portion of the semiconductor substrate 1 is exposed by etching the gate electrode material 8, the laminated film 7, the gate electrode material 13 and the oxide film 11 by using the dry etcher, and then, the anti-reflection film and the resist film are removed by the wet removing process.

FIG. 9H: Next, n-type impurities are ion-implanted vertically into the exposed substrate by a self-aligned process with the gate electrodes 8 and 13, and then the source region 2 and the drain region 3 are formed by an activation process. As shown in the area surrounded by the broken line, the source region 2 and the drain region 3 are formed in the semiconductor substrate 1 so as to sandwich the gate electrodes 8 and 13 therebetween.

As mentioned above, the non-volatile memory device according to the present invention can be formed.

Hereinafter, the present invention is described in more detail by referring to some examples. These examples are the specific examples and provided for a further in-depth understanding of the present invention, therefore the present invention is not limited to these specific examples at all.

EXAMPLE 1

(Structure)

FIG. 10 shows an example of a cross sectional view taken along the channel direction of a trap type memory as a non-volatile memory device according to the present invention. As shown in FIG. 10, the laminated films 7 composed of the insulating film 4, the charge storage layer 5, and the insulating film 6 is formed on one of principal surfaces (upper side surface in the figure) of the semiconductor substrate 1, and additionally, the gate electrode 8 is formed on the laminated film 7. The gate electrode 13 is formed so as to contact with both the gate electrode 8 and the semiconductor substrate 1 with the insulating film 11 interposed therebetween. The source region 2 and the drain region 3 are formed in the semiconductor substrate 1 so as to sandwich the two electrodes of the gate electrode 13 and the gate electrode 8. A physical thickness of the film, in the portion of the insulating film 11 existing between the gate electrode 13 and the semiconductor substrate 1 and contacting with the laminated film 7, is greater than that in the portion of the insulating film 11 not contacting with the laminated film 7.

(Operation Method)

In this example, in writing data, the hot electron is generated by applying a positive voltage to the gate electrodes 8, 13 and the drain region 3, and it is injected into the charge storage layer 5 in the laminated film 7. In reading out the data, the positive voltage is applied to the source region 2 and the gate electrodes 8, 13, and the source current value is monitored. When the electron is stored in the charge storage layer 5, it becomes difficult for the current to flow in comparison with a case in which the electron is not stored in the charge storage layer 5, because the flat band in the charge storage layer 5 shifts in the positive direction. In this way, by binarizing the state in which it is difficult or easy for the current to flow, it becomes possible to store the information.

In order to delete the stored information, a negative voltage is applied to the gate electrode 8, and the electron is deleted from the charge storage layer 5 by utilizing a Fowler-Nordheim (FN) type tunneling current. Alternatively, by means of applying a negative voltage to the gate electrode 8, applying a positive voltage to the drain region 3, and injecting a hole generated by band-to-band tunneling in the semiconductor substrate 1 into the charge storage layer 5, the electron in the charge storage layer 5 can be neutralized.

(Effect)

This non-volatile memory device has the following effects. Because the film thickness of the insulating film 11 in the region β contacting with the laminated film 7 under the gate electrode 13 is greater than the film thickness of the insulating film 11 on the region a not contacting with the laminated film 7 under the gate electrode 13, the threshold value in the region β is greater than the threshold value in the region α.

For this reason, even if the writing current (channel current) is the same, it becomes difficult for the voltage drop from the source to the drain to arise in the region α with low channel resistance in comparison with the related structure II in which the film thickness of the insulating film under the gate electrode 13 is constant in a plane. As a result, because the voltage drop is concentrated in the region β of the high resistance region being located near the charge storage layer 5, and the electron in the channel is easily accelerated (easily become hot), the electron injection efficiency into the charge storage layer 5 is improved. That is, the writing efficiency (a value obtained by dividing an amount of the channel hot electron injected into the charge storage layer per unit time by the channel current flowing from the source to the drain) is improved.

Because the film thickness of the insulating film 11 contacting with the memory gate is large, the electric field applied into the semiconductor substrate 1 from the gate electrode 13 near the memory gate is reduced. Therefore, the band-to-band tunneling current arising near the memory gate (region β) under the word gate can be suppressed. For this reason, as shown in FIG. 8, the threshold variation during the disturbing time in the unselected cell C at the time of the writing operation shown in FIG. 3C can be reduced in comparison with the related structure II in which the film thickness of the insulating film under the gate electrode 13 is constant (equal to an in-plane average value of the insulating film 11) in a plane.

Because the film thickness of the insulating film 11 contacting with the source region is small, the electric field applied into the semiconductor substrate 1 from the gate electrode 13 near the source region is strengthened. Therefore, the punch-through current, which is generated by the connection of the depletion layer in the source side and the depletion layer in the drain side near the source region, can be efficiently suppressed.

For this reason, as shown in FIG. 8, the threshold variation during the disturbing time in the unselected cell B at the time of the writing operation shown in FIG. 3C can be reduced in comparison with the related structure II in which the film thickness of the insulating film under the gate electrode 13 is constant (equal to an in-plane average value of the insulating film 11) in a plane.

As shown in FIG. 8, the disturbance variation in both the cell arrangement B and the cell arrangement C can be reduced in comparison with the related structure II in which the equivalent oxide thickness in the insulating film under the gate electrode 13 is constant in a plane. Therefore, the minimum value in the sum of the disturbance variations in the cell arrangement B and the cell arrangement C is efficiently reduced, that is, the disturbance resistance can be improved.

EXAMPLE 2

Hereinafter, an example of a method of manufacturing the trap type memory (non-volatile memory device) shown in FIG. 10 is described with reference to the drawings. The drawings from FIG. 11A to FIG. 11H are process charts showing an example of a manufacturing method of the non-volatile memory device according to the present invention.

FIG. 11A: First, the oxide film (tunnel insulating film material) 4 and the nitride film (charge storage layer material) 5 are deposited in order on the surface of the P type semiconductor substrate 1 by using the CVD method. And oxide film (insulating film B material) 6 is formed by oxidizing an upper part of the nitride film 5 by using ISSG (In-situ Steam Generation), the laminated film 7 composed of the oxide film 4, the nitride film 5 and the oxide film 6 is formed.

Next, a phosphorus doped silicon film (gate electrode material) 8 is deposited on the oxide film 6 in the laminated film 7 by using the CVD method. An anti-reflection film and a resist film are deposited, patterned by exposure and development, and a predetermined portion of the semiconductor substrate 1 is exposed by etching the gate electrode material 8 and the laminated film 7 by using the dry etcher, and then the anti-reflection film and the resist film are removed by a wet removing process.

FIG. 11B: Next, the oxide film 11 and the phosphorus doped silicon 13 are deposited on a whole area of one principal surface (upper side surface in the figure) of a wafer by using the CVD method.

FIG. 11C: Next, the gate electrode material 13 is etched back by the dry etching so as to be left only on the both side walls of the gate electrode material 8.

FIG. 11D: Next, by using the gate electrode 13 formed on the side of the gate electrode 8 as a mask, the upper part of the oxide film 11 is partially removed by the continuous dry etching process, and then, the damage in the oxide film caused by the etching is recovered by annealing process.

FIG. 11E: Next, the phosphorus doped silicon film 13 is deposited on a whole area of one principal surface.

FIG. 11F: Next, a part of the gate electrode material 13 and a part of the oxide film 12 are removed by a CMP (Chemical Mechanical Polishing) process, and then, an upper end portion of the gate electrode material 8 is exposed.

FIG. 11G: Next, the anti-reflection film and the resist film are deposited, patterned by exposure and development, and the semiconductor substrate 1 is exposed by etching a predetermined portion of the gate electrode material 8, the laminated film 7, the gate insulation film 13 and the oxide film 11 by using the dry etcher. Afterwards, the anti-reflection film and the resist film are removed by the wet removing process.

FIG. 11H: Next, n-type impurities are ion-implanted vertically into the exposed substrate by a self-aligned process with the gate electrodes 8 and 13, and then the source region 2 and the drain region 3 are formed by an activation process. As shown in the area surrounded by the broken line, the source region 2 and the drain region 3 are formed in the semiconductor substrate 1 so as to sandwich the gate electrodes 8 and 13 therebetween.

As mentioned above, the non-volatile memory device shown in FIG. 10 can be formed.

EXAMPLE 3

Further, the non-volatile memory device of this example shown in FIG. 10 can be formed by using a manufacturing method shown in FIG. 12A to FIG. 12E. The drawings from FIG. 12A to FIG. 12E are process charts showing another example of a manufacturing method of the non-volatile memory device according to the present invention.

FIG. 12A: First, the oxide film 11 is deposited on the surface of the P type semiconductor substrate 1 by using the CVD method and the phosphorus doped silicon film (gate electrode material) 13 is deposited on the oxide film 11 by using the CVD method. The anti-reflection film and the resist film are deposited, patterned by exposure and development, and then, a predetermined portion of the semiconductor substrate 1 is exposed by etching the gate electrode material 13 and the oxide film 11 by using the dry etcher. Afterwards, the anti-reflection film and the resist film are removed by the wet removing process.

FIG. 12B: Next, a bird's beak is introduced in a boundary portion that is exposed after the etching in the oxide film 11 which is sandwiched between the semiconductor substrate 1 and the gate electrode material 13 by performing an oxidation treatment, and the oxide film 11 is reshaped. The surplus oxide film, which is formed on the upper surface of the semiconductor substrate 1 and the upper surface of the gate electrode material 13, is removed by the dry etching.

FIG. 12C: Next, the oxide film (tunnel insulating film material) 4 and the nitride film (charge storage layer material) 5 are deposited in order on a whole area of one principal surface (upper side surface in the figure) of a wafer by using the CVD method. And oxide film (insulating film B material) 6 is formed by oxidizing an upper part of the nitride film 5 by using ISSG (In-situ Steam Generation), the laminated film 7 composed of the oxide film 4, the nitride film 5 and the oxide film 6 is formed.

Next, the phosphorus doped silicon film (gate electrode material) 8 is deposited on the oxide film 6 of the laminated film 7 by using the CVD method. After that, a part of the gate electrode material 8 and a part of laminated film 7 are removed by a CMP (Chemical Mechanical Polishing) process, and then, an upper end portion of the gate electrode material 13 is exposed.

FIG. 12D: Next, the anti-reflection film and the resist film are deposited, patterned by exposure and development, and the semiconductor substrate 1 is exposed by etching a predetermined portion of the gate electrode material 8, the laminated film 7, the gate electrode material 13 and the oxide film 11 by using the dry etcher, and then, the anti-reflection film and the resist film are removed by the wet removing process.

FIG. 12E: Next, n-type impurities are ion-implanted vertically into the exposed substrate by a self-aligned process with the gate electrodes 8 and 13, and then the source region 2 and the drain region 3 are formed by an activation process. As shown in the area surrounded by the broken line, the source region 2 and the drain region 3 are formed in the semiconductor substrate I so as to sandwich the gate electrodes 8 and 13 therebetween.

As mentioned above, the non-volatile memory device shown in FIG. 10 can be formed. In the process shown in FIG. 12A to FIG. 12E, it is not necessary to deposit the gate electrode material twice in comparison with the process shown in FIG. 11A to FIG. 11H. Therefore, the number of steps of the processes can be reduced, and a process cost can be reduced.

Further, it is not necessary that the source region and the drain region are arranged at the same level in the semiconductor substrate 1 and also it is not necessary that the channel is formed on the same plane in the semiconductor substrate 1. Accordingly, as shown in FIG. 13, a structure may be used in which the level of the boundary plane between the insulating.

film 11 and the semiconductor substrate 1 is lower than the level of the boundary plane between the laminated film 7 and the semiconductor substrate 1. If the equivalent oxide thickness, in the portion of the insulating film 11 existing between the gate electrode 13 and the semiconductor substrate 1 and contacting with the laminated film 7, is greater than that in the portion of the insulating film 11 not contacting with the laminated film 7, the same effect can be obtained like a case of the plane.

EXAMPLE 4

FIG. 13 is a cross sectional view showing the other example of a non-volatile memory device according to the present invention. The drawings from FIG. 14A to FIG. 14E are process charts showing an example of a manufacturing method of the non-volatile memory device shown in FIG. 13.

FIG. 14A: First, the oxide film (tunnel insulating film material) 4 and the nitride film (charge storage layer material) 5 are deposited in order on the surface of the P type semiconductor substrate 1 by using the CVD method. Additionally, the oxide film (insulating film B material) 6 is formed by oxidizing an upper part of the nitride film 5 by using ISSG (In-situ Steam Generation), and the laminated film 7 composed of the oxide film 4, the nitride film 5 and the oxide film 6 is formed.

Next, a phosphorus doped silicon film (gate electrode material) 8 is deposited on the oxide film 6 in the laminated film 7 by using the CVD method. An anti-reflection film and a resist film are deposited, patterned by exposure and development, and part of the gate electrode material 8, the laminated film 7, and the upper part of the semiconductor substrate 1 are etched by using the dry etcher, and then the anti-reflection film and the resist film are removed by a wet removing process.

FIG. 14B: Next, the oxide film 11 is deposited on a whole area of one principal surface (upper side surface in the figure) of a wafer by using the CVD method, and then the oxide film 11 is etched back so as to be left only on the both side walls of the gate electrode material 8.

FIG. 14C: Next, the oxide film 11 and the gate insulating material 13 are deposited in order on a whole area of one principal surface of the wafer by using the CVD method, and then the gate insulating material 13 and the oxide film 11 are etched back so as to be left only on the convex side surface.

FIG. 14D: Next, the anti-reflection film and the resist film are deposited, patterned by exposure and development, and a predetermined portion of the semiconductor substrate 1 is exposed by etching the gate electrode material 8 and the laminated film 7 by using the dry etcher, and then, the anti-reflection film and the resist film are removed by the wet removing process.

FIG. 14E: Next, n-type impurities are ion-implanted vertically into the exposed semiconductor substrate 1 by a self-aligned process with the gate electrodes 8 and 13, and then the source region 2 and the drain region 3 are formed by an activation process. As shown in the area surrounded by the broken line, the source region 2 and the drain region 3 are formed in the semiconductor substrate 1 so as to sandwich the gate electrodes 8 and 13. therebetween.

In this way, the non-volatile memory device shown in FIG. 13 can be formed.

As mentioned above, in the non-volatile memory device according to the present invention, the improvement of the writing efficiency and the improvement of the disturbance resistance can be realized simultaneously.

Hereinafter, the difference between the present invention and the invention described in the patent document 3 that is thought to be most related to the present invention is described. A floating gate 4 described in the abstract of the patent document 3 is apparently similar to the first gate electrode in the present invention. However, although the floating gate 4 in the patent document 3 is clearly described as the gate, it is isolated as shown in FIG. 16 of the patent document 3, and it is not electrically connected to any other part (in this meaning, it represents a "floating gate")

In contrast, the first gate electrode in the present invention is the electrode to which the voltage is applied. Therefore, this gate is different from the floating gate described in the patent document 3.

The largest difference between the present invention and the invention described in the patent document 3 is that the invention described in the patent document 3 relates to a floating type memory while the present invention relates to a trap type memory.

The trap type memory requires the memory gate additionally in order to erase the electron injected into the charge storage layer (trap film). The trap type memory differs structurally from the floating type memory in which the charge storage layer is equal to the memory gate (floating gate) that is electrically disconnected from the outside.

In other words, while the number of the gate electrically controlled in one element is two in the trap type memory with a split gate structure, in the floating type memory similar to a split gate structure, the number of the gate electrically controlled in one element is one. This is the difference between both memories.

In the trap type memory with the split gate structure, because the strong positive voltage is applied to the memory gate in writing operation, the disturbance arises in the unselected cell due to the band-to-band tunneling effect at the boundary between the memory gate and the word gate. This disturbance and also the disturbance due to the punch through effect can be improved for the first time by means of the present invention.

In the floating type memory similar to the split gate structure, because the voltage is not applied to the floating gate in the unselected cell in writing operation, the disturbance due to the band-to-band tunneling effect does not arise at the boundary between the floating gate (which represents the memory gate in the expression corresponding to the trap type memory) and the word gate (which represents the control gate in the expression corresponding to the trap type memory).

Therefore, the technology described in the patent document 3 differs from the present invention with respect to a constitution, an operation and effect.

BRIEF DESCRIPTION OF DRAWINGS

FIG. 3A to FIG. 3C are views illustrating a non-volatile memory device related to the present invention.

FIG. 4A and FIG. 4B are views illustrating a characteristic of a non-volatile memory device related to the present invention.

FIG. 9A to FIG. 9H are process charts showing a manufacturing method of a trap type memory as a non-volatile memory device.

FIG. 11A to FIG. 11H are process charts showing an example of a manufacturing method of the non-volatile memory device according to the present invention.

FIG. 14A to FIG. 14E are process charts showing an example of a manufacturing method of the non-volatile memory device shown in FIG. 13.

Figure 1A:
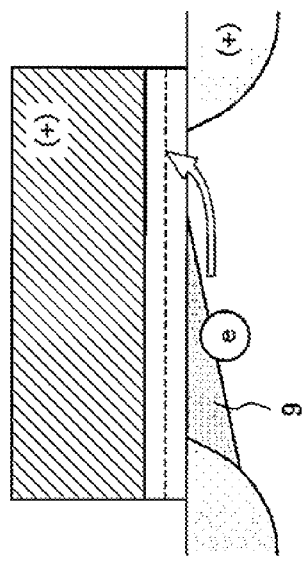
FIG. 1A to FIG. 1D are views illustrating a non-volatile memory device related to the present invention.
Figure 1C:
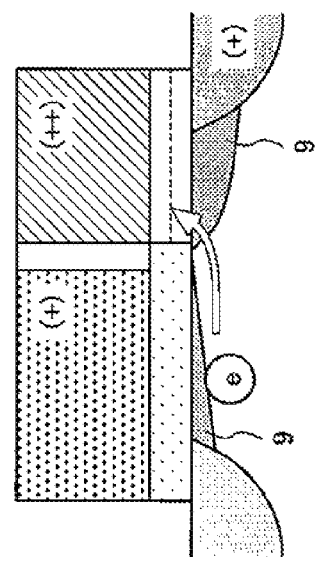
Figure 1B:
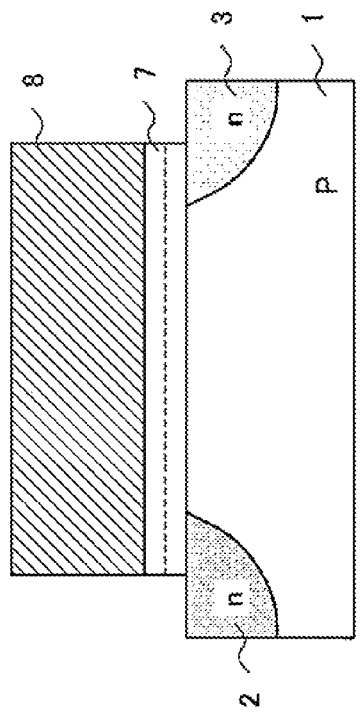
Figure 1D:
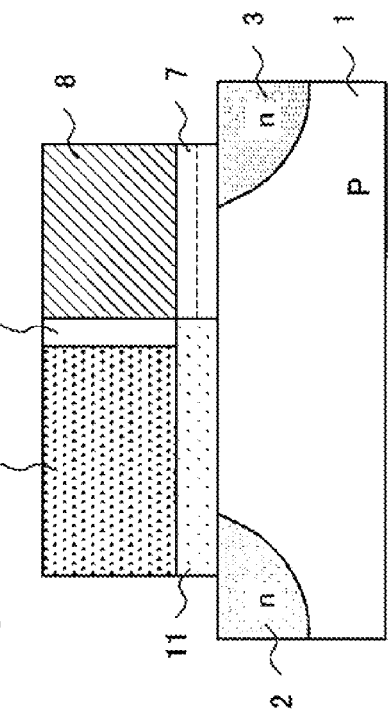
Figure 2B:
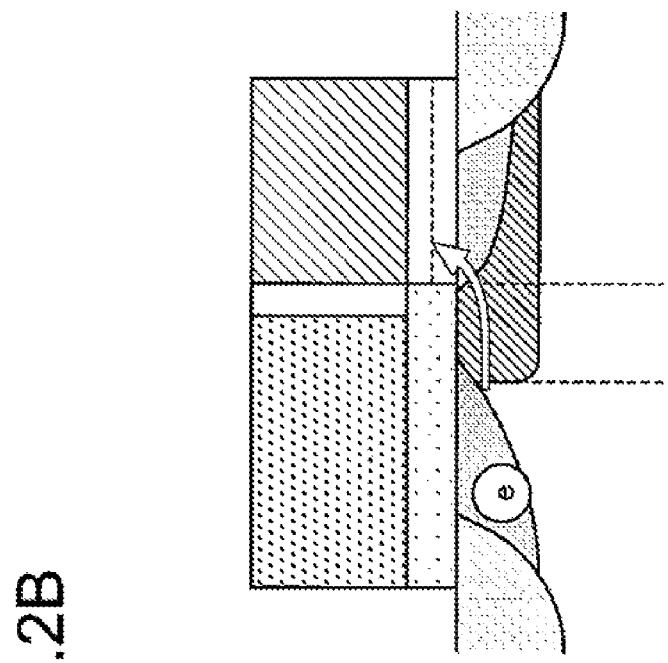
FIG. 2A and FIG. 2B are views illustrating an operation of a non-volatile memory device related to the present invention.
Figure 2A:
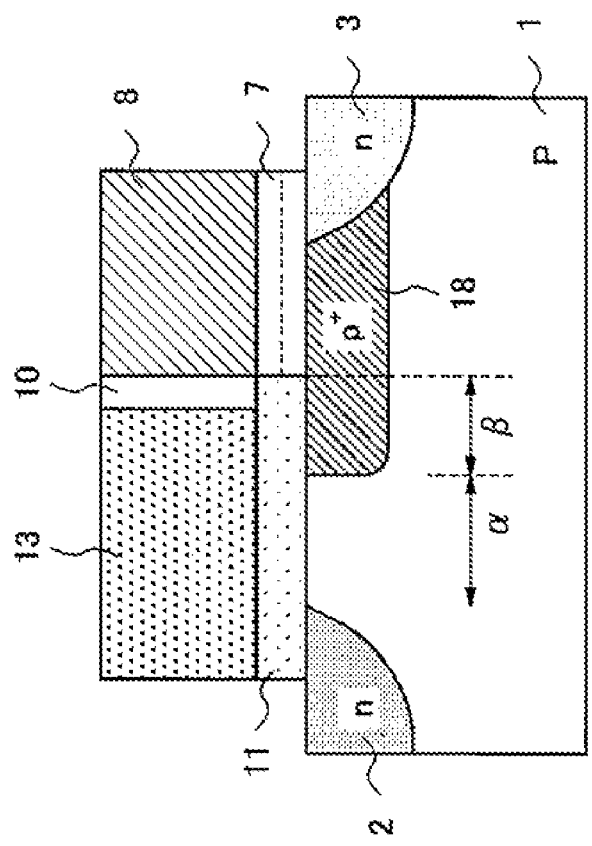
Figure 5:
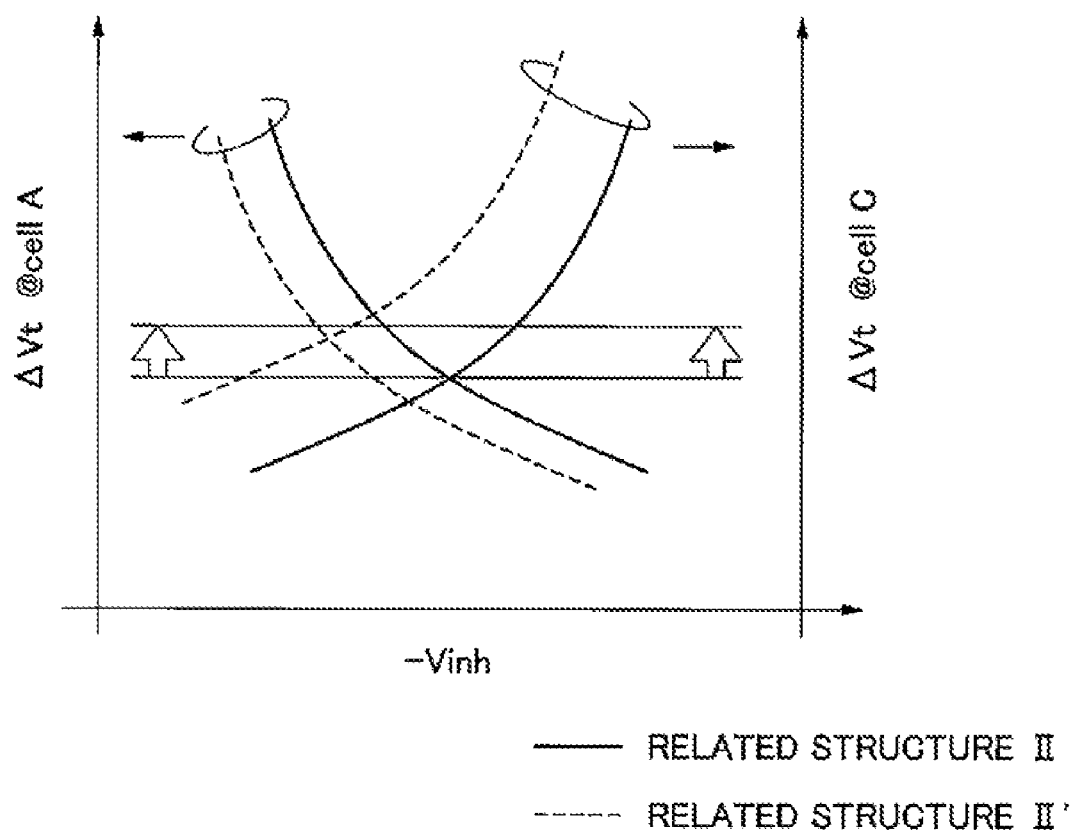
FIG. 5 is a view comparing the disturbance resistance in the related structure II', whose writing efficiency is improved by increasing the channel doping concentration in a region β contacting with a laminated film in a word gate, with the disturbance resistance in the related structure II.
Figure 6:
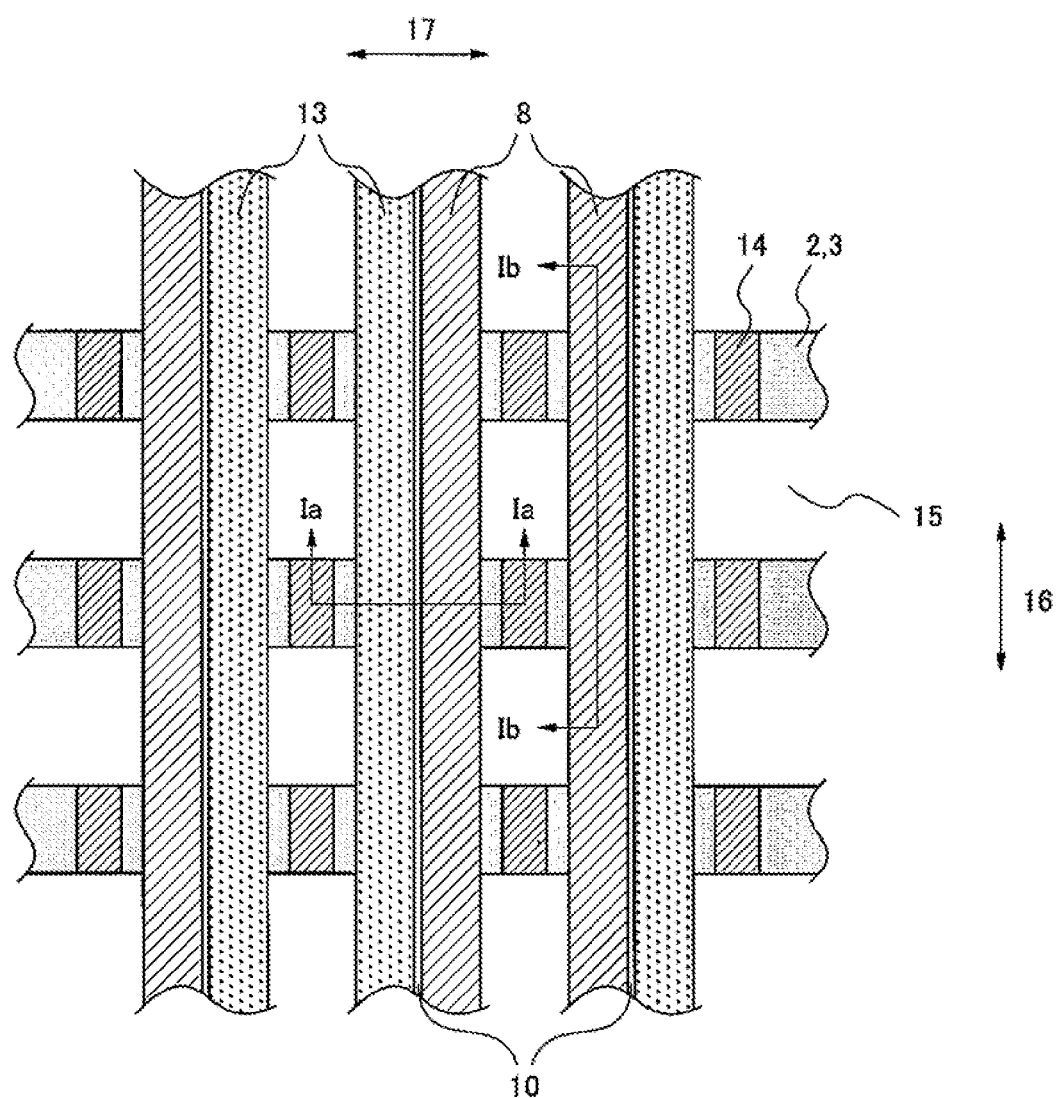
FIG. 6 is a top view of one exemplary embodiment of a non-volatile memory device according to the present invention.
Figure 7A:
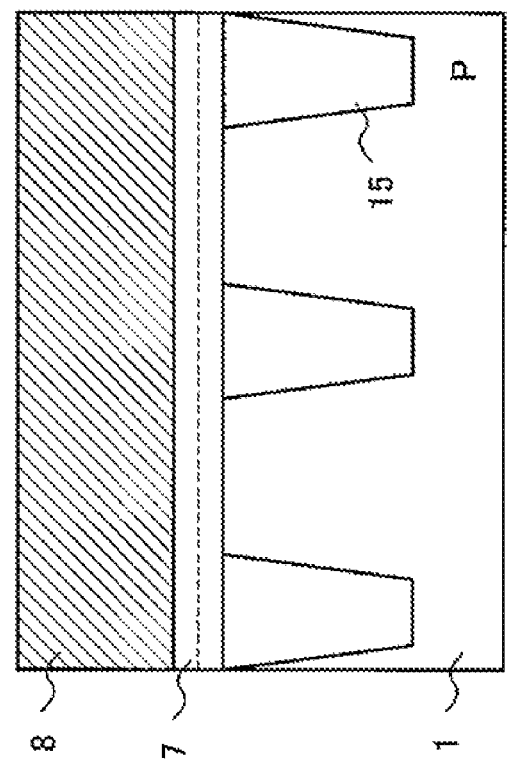
FIG. 7A is a cross sectional view taken along the line Ia-Ia in one exemplary embodiment of a non-volatile memory device according to the present invention.
Figure 7B:
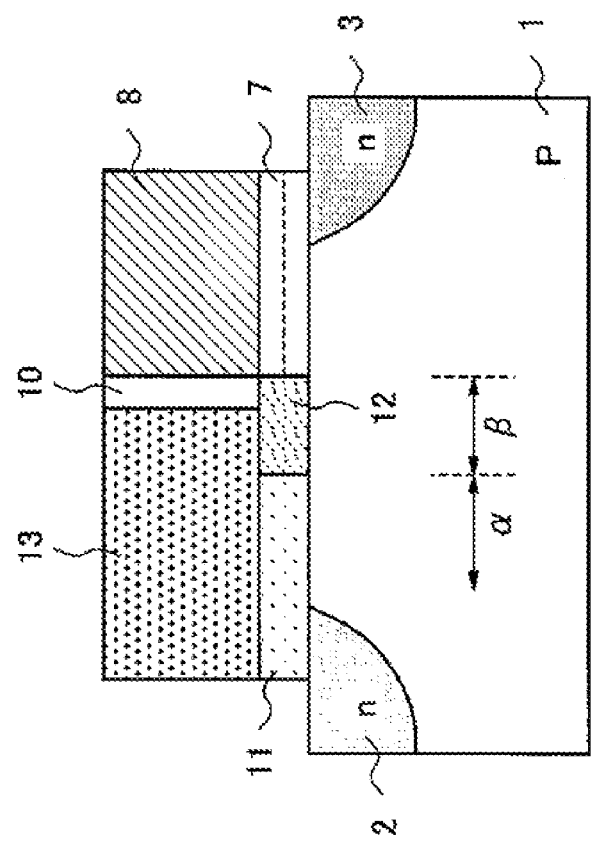
FIG. 7B is a cross sectional view taken along the line Ib-Ib in FIG. 6.
Figure 8:
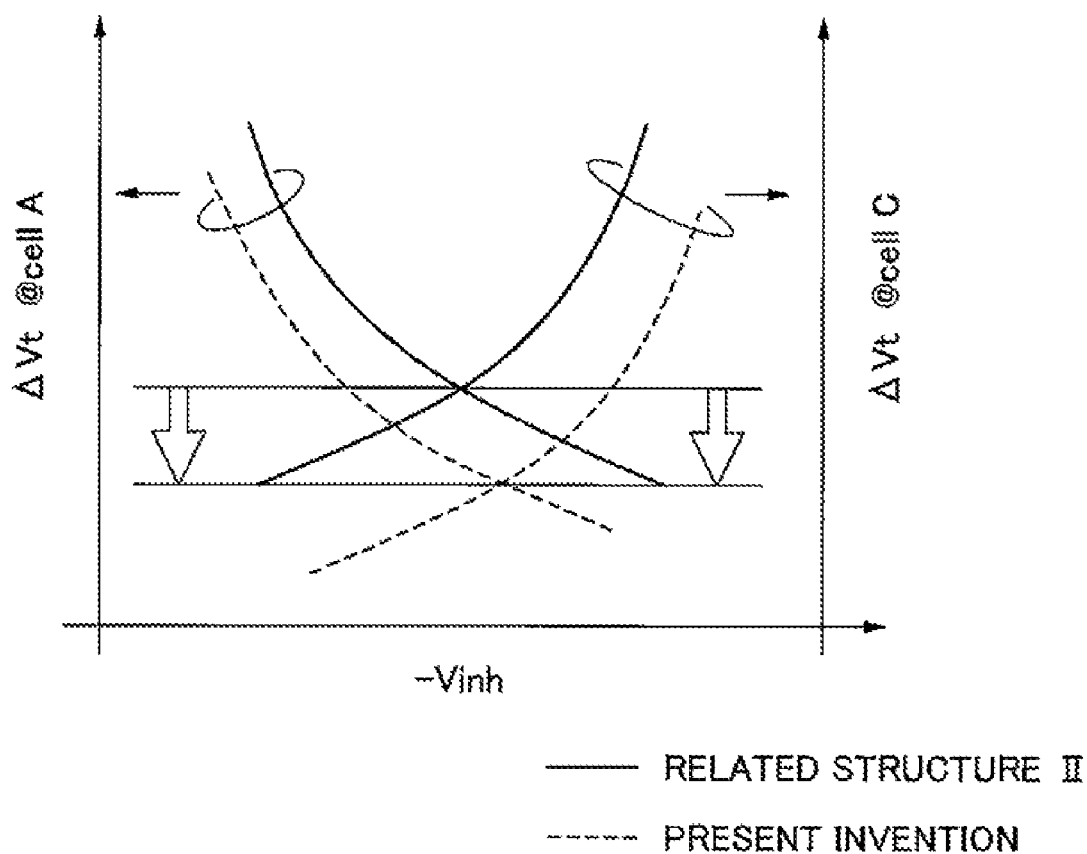
FIG. 8 is a view for illustrating a non-volatile memory device according to the present invention.
Figure 10:
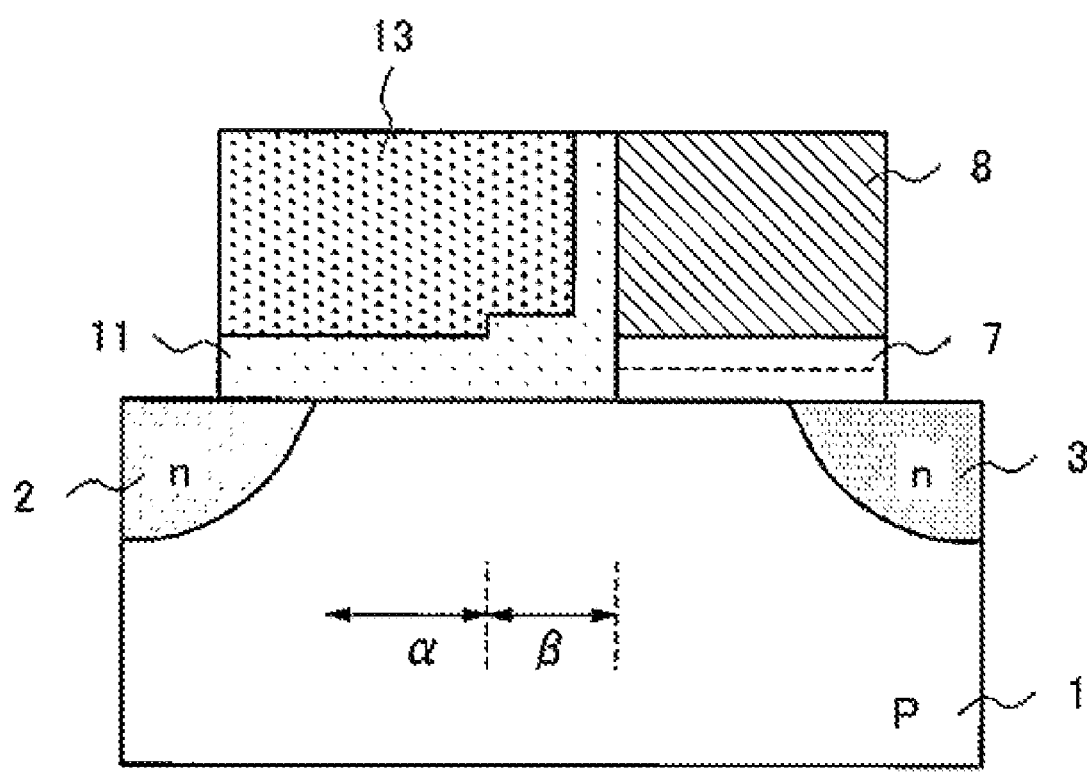
FIG. 10 is an example of a cross sectional view taken along the channel direction of a trap type memory as a non-volatile memory device according to the present invention.
Figure 12A:
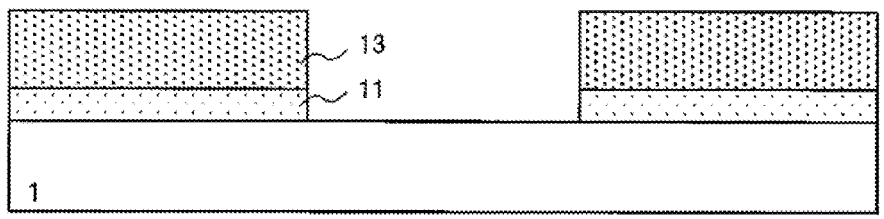
FIG. 12A to FIG. 12E are process charts showing another example of a manufacturing method of the non-volatile memory device according to the present invention.
Figure 12B:
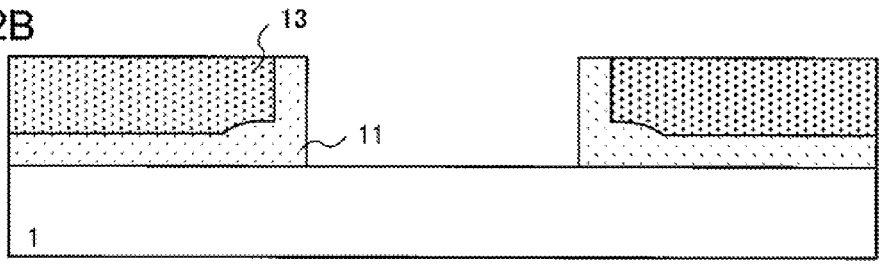
Figure 12C:
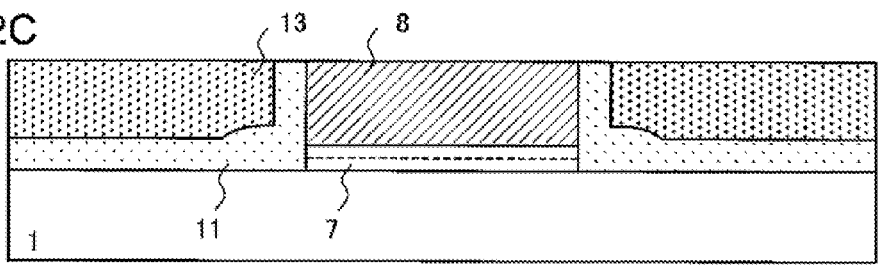
Figure 12D:
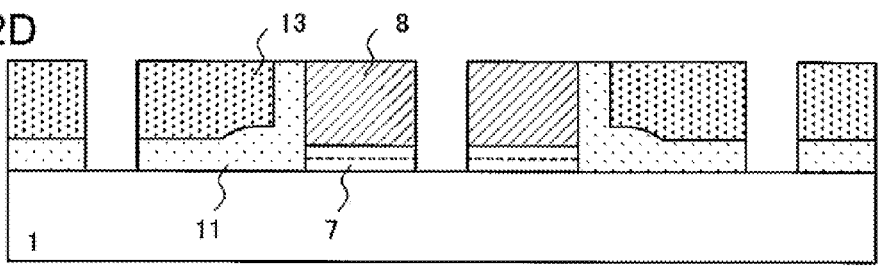
Figure 12E:
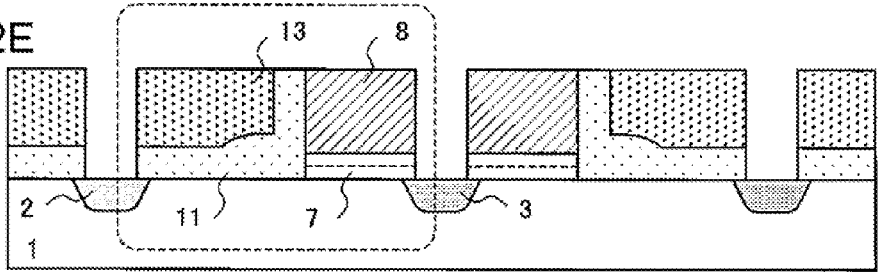
Figure 13:
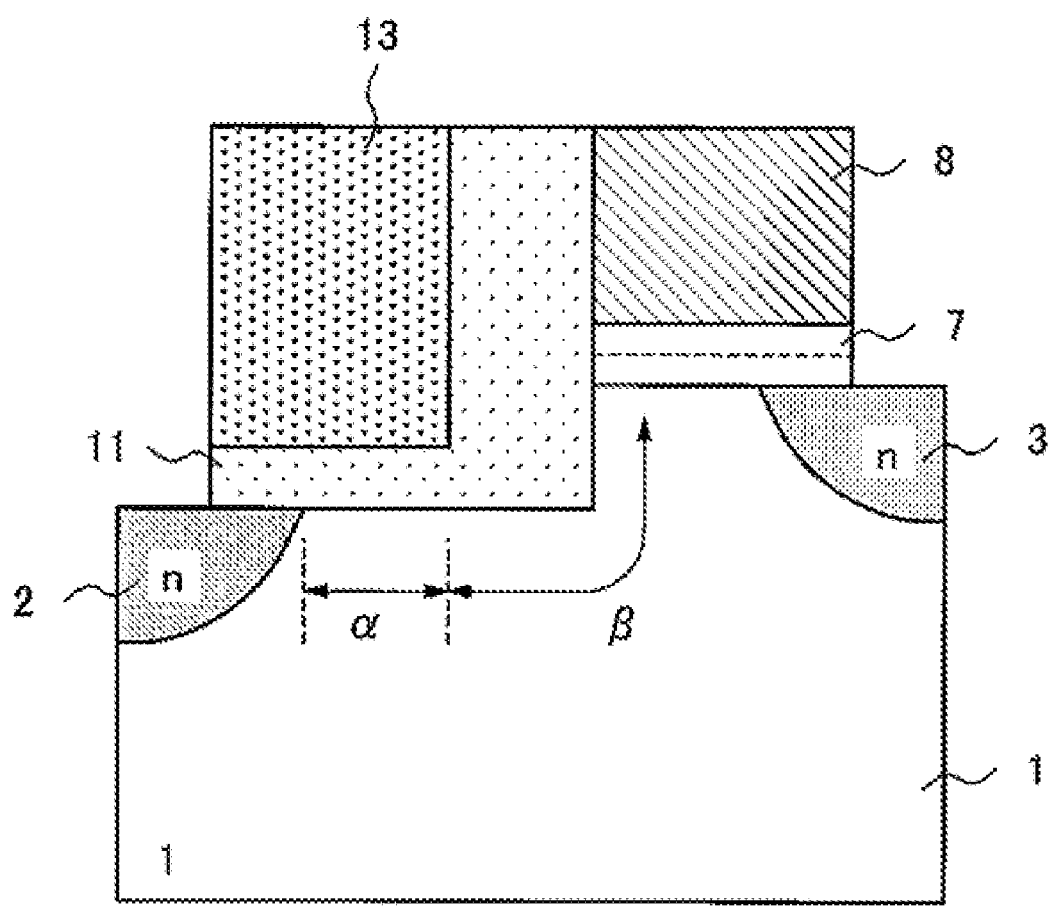
FIG. 13 is a cross sectional view showing the other example of a non-volatile memory device according to the present invention.

DESCRIPTION OF THE CODES 1 semiconductor substrate (silicon substrate)
2 first impurity diffusion region (source)
3 second impurity diffusion region (drain)
4 insulating film (tunnel insulating film)
5 charge storage layer
6 insulating film
7 laminated film
8, 13 gate electrode
9 inversion layer
10 to 12 insulating film
13 second gate electrode
14 contact
15 isolation region
16 predetermined direction (1)
17 predetermined direction (2)
18 diffusion layer

The invention claimed is:

1. A non-volatile memory device, comprising:
a substrate;
a laminated film storing an electric charge formed on the substrate;
a first gate electrode formed on the laminated film;
a second gate electrode formed so as to contact with the first gate electrode and the substrate with a first insulating film and a second insulating film interposed therebetween, respectively; and
a first and a second impurity diffusion layer formed in the substrate so as to sandwich the first gate electrode and the second gate electrode and
an equivalent oxide thickness of the second insulating film in a part contacting with the laminated film is greater than that of the second insulating film in a part not contacting with the laminated film.

2. The non-volatile memory device according to claim 1, characterized in that
a physical thickness of a film, in a portion of the second insulating film contacting with the laminated film, is greater than that in a portion of the second insulating film not contacting with the laminated film.

3. The non-volatile memory device according to claim 1, characterized in that
a dielectric constant of a film, in a portion of the second insulating film contacting with the laminated film, is lower than that in a portion of the second insulating film not contacting with the laminated film.

4. The non-volatile memory device according to claim 3, characterized in that
a portion of the second insulating film not contacting with the laminated film is made of a material having higher dielectric constant than that of a material in a portion of the second insulating film contacting with the laminated film.

5. The non-volatile memory device according to claim 4, characterized in that
a portion of the second insulating film contacting with the laminated film is made of silicon oxide, and a portion of the second insulating film not contacting with the laminated film is made of one selected from the group consisting of oxynitride silicon, alumina, hafnium silicate, oxidized hafnium silicate, aluminum silicate, and oxidized aluminum silicate.

6. The non-volatile memory device according to claim 3, characterized in that
a dielectric constant in portion of the second insulating film not contacting with the laminated film is higher by doping than that in a portion of the second insulating film contacting with the laminated film.

7. The non-volatile memory device according to claim 6, characterized in that
the second insulating film is made of silicon oxide and nitrogen is doped to a portion not contacting with the laminated film.

8. The non-volatile memory device according to claim 1, characterized in that
the laminated film having a function to store the electric charge has a two-layer structure composed of a tunnel insulating film and a charge storage layer in order from the substrate.

9. The non-volatile memory device according to claim 8, characterized in that
the charge storage layer is made of a silicon nitride film, an oxynitride silicone film, an alumina film, a hafnium silicate film, an oxidized hafnium silicate, or an aluminum silicate film, and the tunnel insulating film is made of a silicon oxide film or an oxynitride silicone film.

10. The non-volatile memory device according to claim 8, characterized in that
the charge storage layer further has an insulating film thereon where the tunnel insulating film is arranged, and the insulating film is made of silicon oxide or an oxynitride silicone film.

* * * * *